US006825670B2

(12) United States Patent
Bussinger (10) Patent No.: US 6,825,670 B2
(45) Date of Patent: Nov. 30, 2004

(54) METHOD AND DEVICE FOR TESTING A TELECOMMUNICATION CABLE (75) Inventor: Jean Bussinger, Saint Anastasie sur Issole (FR)

(73) Assignee: Socrat, Sollies-Pont (FR)

( * ) Notice: Subject to any disclaimer, the term of this patent is extended or adjusted under 35 U.S.C. 154(b) by 173 days.

(21) Appl. No.: 10/196,070

(22) Filed: Jul. 15, 2002

(65) Prior Publication Data

US 2003/0006780 A1 Jan. 9, 2003

Related U.S. Application Data

(63) Continuation of application No. PCT/FR01/00171, filed on Jan. 19, 2001.

(30) Foreign Application Priority Data

Jan. 26, 2000 (FR) .............................. 00 00970

(51) Int. Cl.[7] .......................... G01R 31/08; H01H 31/12
(52) U.S. Cl. ........................ 324/523; 324/522; 324/551
(58) Field of Search ................................ 324/523, 551, 324/522, 512, 520, 525, 527, 529, 530

(56) References Cited

U.S. PATENT DOCUMENTS

| 4,103,225 A | 7/1978 | Stephens | .................. | 324/678 |
| 6,538,450 B2 * | 3/2003 | Bussinger | ................ | 324/523 |

FOREIGN PATENT DOCUMENTS

EP          0 408 480 A1      7/1990

OTHER PUBLICATIONS

E.C. Bascom et al., "Computerized Underground Cable Fault Location Expertise", Proceedings Of The Power Engineering Society Transmission And Distribution Conference, pp. 376–382, (1994).

* cited by examiner

Primary Examiner—Anjan Deb
Assistant Examiner—Donald M Lair
(74) Attorney, Agent, or Firm—Akin Gump Strauss Hauer & Feld, LLP (57) ABSTRACT

The present invention relates to a method for testing a conductor element (20) applicable to locating a continuity defect of the conductor element, the conductor element having, relative to a reference conductor, an insulation resistance and a leak capacitance. According to the present invention, the method comprises a step of injecting into the conductor element at least two currents ($i_1$, $i_2$) of different frequencies by means of a current or voltage generator (23), one terminal of which is connected to the reference conductor, at least one step of measuring the amplitudes of currents at one measuring point ($P_i$) chosen along the conductor element, and a step of calculating the imaginary part of currents and/or calculating the leak capacitance of the conductor element downstream from the measuring point ($P_1$).

9 Claims, 4 Drawing Sheets

METHOD AND DEVICE FOR TESTING A TELECOMMUNICATION CABLE

CROSS REFERENCE TO RELATED APPLICATION

This application is a continuation of International Application No. PCT/FR01/00171, filed Jan. 19, 2001, and the disclosure of which is incorporated herein by reference.

The present invention relates to a method for testing a conductor element, applicable to locating a continuity defect of the conductor element. The present invention relates, in particular, to testing the electrical continuity of the metal screen of a telecommunication cable.

Figure 1A:
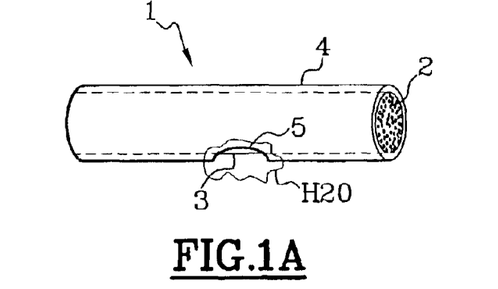
FIGS. 1A, 1B described above represent a telecommunication cable.

Current telecommunication networks, that have a tree structure, are produced by means of cables 1 with a large section of the type represented in FIG. 1A, comprising several hundred or thousand electric wires 2 insulated from each other by a suitable wrapping and arranged two by two to form telephone pairs. The assembly is protected from electric disturbance by a metal sheath, or screen 3, that is itself covered by a protective sheath 4 made of an electrically insulating material such as polyethylene, PVC, . . .

Figure 1B:
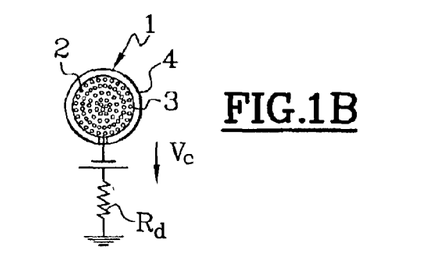

Such telecommunication cables, arranged in the ground or in the air, are subjected to various attacks the most frequent of which are caused by lightning, rodents, road works, the rubbing of tree branches . . . These various attacks can lead to a tear 5 of the protective sheath and to the penetration of water into the cable. From an electrical point of view, such deterioration results in an insulation defect of the screen 3 relative to the ground, represented in a diagram in FIG. 1B by a resistance Rd, and leads to the occurrence of a voltage Vc, or "screen potential", generated, in particular, by the combination of the metal of the screen 3 with water and various metal oxides. When a tightness defect is not repaired in time, the deterioration of the cable extends to the wrapping of the electric wires and develops over a substantial cable length due to the spread of water.

Therefore, testing the proper tightness of cables is a major concern for telecommunication operators and more and more needs to be automated with a view to reducing maintenance costs and working time on site.

Another test that must be performed on networks of telecommunication cables is that of the electrical continuity of screens, that are generally connected to the ground at their ends to allow the flow of electric charges brought about by electromagnetic disturbance or rises in the electric potential in the ground. The testing of the electrical continuity of screens between two connection points to the ground is also currently a major concern for telecommunication operators, as the latter must guarantee optimal performances of their networks due to the increase in the rates of digital data transfer imposed by the development of the Internet network and other computer applications.

In recent years, the applicant has designed, developed and perfected an automatic surveillance system for telecommunication networks constituted by a set of measuring devices marketed under the reference "IMD" (Remote Measuring Interface). Such devices, described in the patent EP 408 480 and in the international application PCT/FR99/02288, are arranged at the connection points to the ground of the metal screens and linked by telephone pairs to a piece of local maintenance equipment, that is itself linked to a regional maintenance centre. They allow various tests and measuring operations to be conducted daily, in particular:

the disconnection of the screens relative to the ground and the measuring of the insulation resistance of the screens and of the screen potential, the detection and location of an insulation defect of a screen by injecting a low frequency voltage, in compliance with a method described in the above-mentioned international application, and the detection of a continuity defect of a screen, by a method called "ground loop".

However, as telecommunication cables are of considerable lengths ranging from approximately one hundred meters to a few kilometres, locating an insulation defect in a segment of cable by means of IMD devices must be completed by a step of precisely locating the defect in the field in order to repair it.

In the above-mentioned international application, the applicant proposed an additional locating method allowing the anomaly affecting a suspect segment of cable to be located on the repair site. As a reminder, this additional locating method consists in injecting into the screen of the suspect portion of cable two currents of different frequencies, measuring the currents at various points of the screen, then calculating the real part of at least one of the two currents to be free from the influence of the leak capacitance of the screen. A sharp drop in the real part of the current at a determined point of the cable allows the insulation defect to be located.

Figure 2:
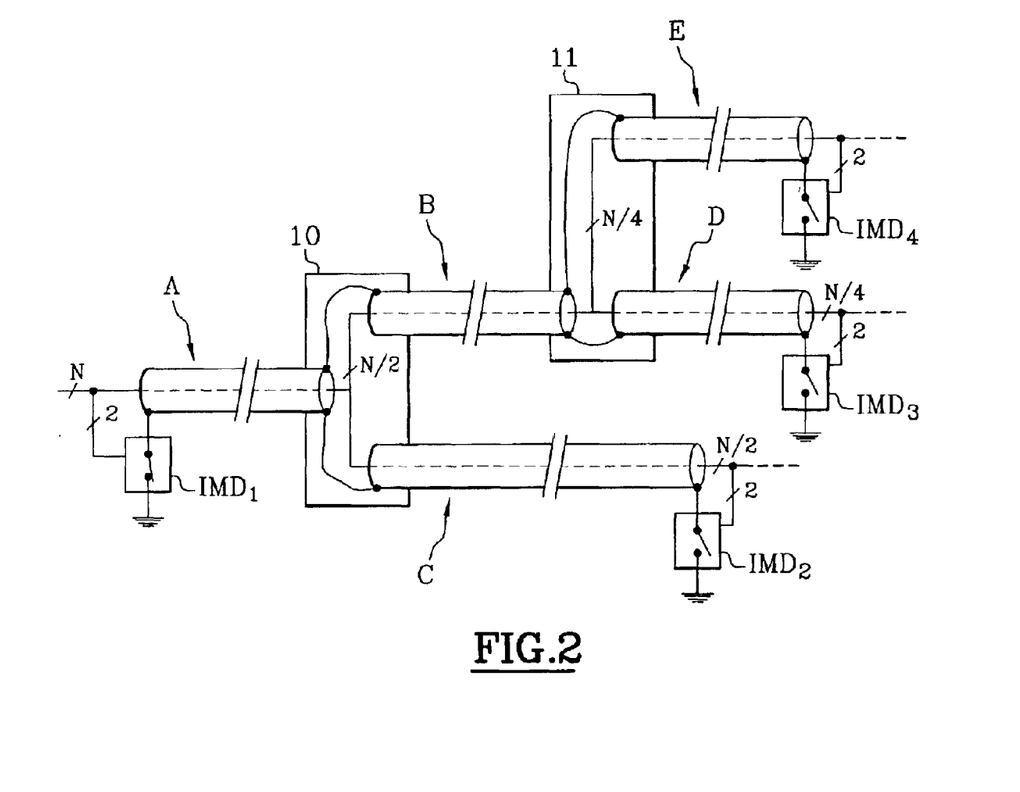
FIG. 2 described above represents a network of telecommunication cables.

A similar problem arises as far as electrical continuity defects are concerned, as the ground loop method allows a continuity defect to be detected in a segment of network without precisely locating the point of discontinuity. For a better understanding, FIG. 2 schematically represents a network of telecommunication cables comprising a cable "A" comprising N wires the end of which is connected by means of a splice box 10 to two cables "B" and "C" comprising N/2 wires each. The cable B is itself connected by means of a splice box 11 to two cables "D" and "E" comprising N/4 wires each. The screen of cable A is connected to the screens of cables B and C and the screen of cable B is connected to the screens of cables D and E. The screen of cable A is connected to the ground at its point of origin through a device IMD1 and the screens of cables C, D, E are connected to the ground at their end points through devices IMD2, IMD3, IMD4.

When measuring a ground loop, for example in the segment ABE, the device IMD1 maintains the point of origin of the screen A connected to the ground while the devices IMD2, IMD3, IMD4 disconnect the end points of the screens C, D, E. The device IMD4 measures the resistance of the loop constituted by the resistance of the screens ABE, the ground resistance of the device IMD1 and its own ground resistance. If the loop resistance is very high, that may mean that the segment ABE has a continuity defect. However, the location of the continuity defect is unknown. The defect may for example be situated in one of the connection boxes 10, 11, and must be located to carry out the repair.

Now, to the applicant's knowledge, no really satisfactory method has yet been proposed to locate the continuity defect of a metal screen in the field, current methods being essentially based on a visual inspection.

The present invention aims to overcome this inconvenience.

More particularly, one general object of the present invention is to provide a method for testing a conductor element applicable to locating an electrical continuity defect, that is precise, reliable and simple to implement.

Another object of the present invention is to provide a device for testing a conductor element applicable to locating an electrical continuity defect, that is small in size and easy to use.

To achieve this object, the present invention is based on the observation that the additional locating method described in the above-mentioned international application is also applicable to locating continuity defects, by calculating the imaginary part of the bifrequency current instead of calculating the real part. A purely capacitive current value is obtained which allows a continuity defect to be located with great precision.

More particularly, the present invention provides a method for testing a conductor element applicable to locating a continuity defect of the conductor element, the conductor element having, relative to a reference conductor, an insulation resistance and a leak capacitance spread along the conductor element, the method comprising a step of injecting into the conductor element at least two currents of different frequencies by means of a current or voltage generator, one terminal of which is connected to the reference conductor, at least one step of measuring the amplitudes of currents at one measuring point chosen along the conductor element, and a step of calculating the imaginary part of at least one of the currents and/or of calculating the leak capacitance of the conductor element downstream from the measuring point, using the measured amplitudes of currents.

According to one embodiment, the method comprises a plurality of steps of measuring the amplitudes of currents at various measuring points, and a plurality of steps of calculating, after each measurement, the imaginary part of at least one of the currents and/or the downstream leak capacitance, an electrical continuity defect of the conductor element being located when the imaginary part calculated and/or the downstream leak capacitance proves to be zero before the end of the conductor element is reached.

The present invention also provides an application of the method above to locating an electrical insulation defect of the conductor element relative to the reference conductor, the method comprising a step of calculating the real part of at least one of the currents and/or the insulation resistance downstream from a measuring point.

According to one embodiment, the method comprises a plurality of steps of measuring the amplitudes of currents at various measuring points, and a plurality of steps of calculating, after each measurement, the real part of at least one of the currents and/or the downstream insulation resistance, an electrical insulation defect being located when the real part calculated shows a clear attenuation and/or when the downstream insulation resistance rapidly rises without this being justified by the topography of the conductor element.

According to one embodiment, the method comprises a step of calculating a formula of type: $K_x \sqrt{[K_y |i_1|^2 - K_z |i_2|^2]}$, in which $|i_1|$ and $|i_2|$ are the amplitudes of currents and $K_x$, $K_y$, $K_z$ are constants.

According to one embodiment, the conductor element comprises several telecommunication cable screens (A–E) connected to each other, and the reference conductor is the ground.

The present invention also relates to a device for testing a conductor element, comprising a connection terminal to a contactless current sensor, an analog/digital conversion circuit of the signal delivered by the current sensor, and a calculation means, in which the calculation means is arranged to analyse the signal delivered by the current sensor and to extract the amplitudes of at least two currents of different frequencies present in the signal delivered, and to calculate the imaginary part of at least one of the currents and/or an electric capacitance by means of a formula of type: $K_1 \sqrt{[K_2 |i_1|^2 - K_3 |i_2|^2]}$, in which $|i_1|$ and $|i_2|$ are the amplitudes of currents and $K_1$, $K_2$, $K_3$ are constants.

According to one embodiment, the calculation means is also arranged to calculate the real part of at least one of the currents and/or an electric resistance, by means of a formula of type: $K_4 \sqrt{[K_5 |i_2|^2 - K_6 |i_1|^2]}$, in which $K_4$, $K_5$ and $K_6$ are constants.

According to one embodiment, the device comprises selection means to choose between the calculation of the imaginary part of at least one of the currents and/or the calculation of an electric capacitance, on the one hand, and the calculation of the real part of at least one of the currents and/or an electric resistance, on the other hand.

According to one embodiment, the device is intended to be connected to a hook-on ammeter, and comprises calibration terminals intended to be interconnected during a calibration phase, and means for injecting onto one of the calibration terminals at least two calibration currents of different frequencies through a standard resistance.

These and other objects, advantages and features of the present invention shall be explained in greater detail in the following description of the theoretical foundations of the method of the present invention, of an example of the application of the method of the present invention to locating a continuity defect in a network of telecommunication cables, and of an example of an embodiment of a measuring device according to the present invention, in relation with the following figures, in which.

Figure 3A:
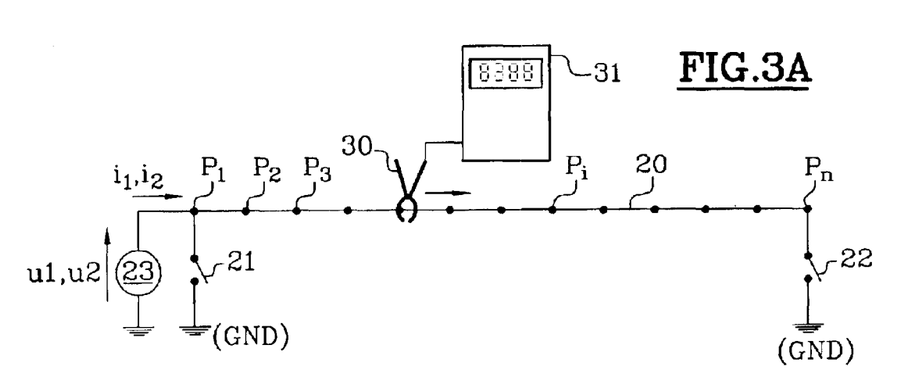
FIG. 3A schematically represents a conductive screen and shows the method according to the present invention.
Figure 3B:
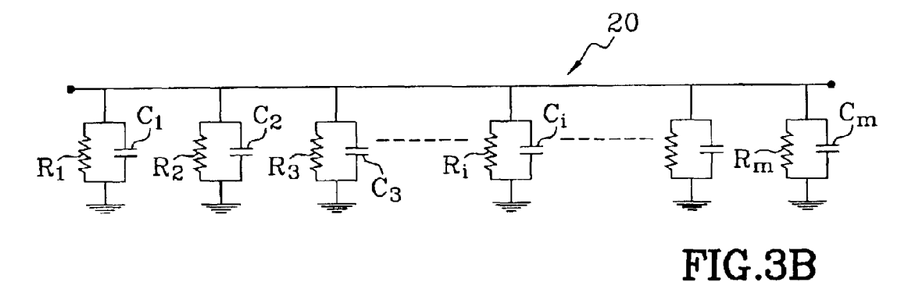
FIG. 3B is the equivalent wiring diagram of the screen in FIG. 3A.

FIG. 3A schematically represents the screen 20 of a telecommunication cable the electrical continuity of which must be tested. The points of origin and the end points of the screen are first disconnected from the ground (GND) by means of two switches 21, 22, for example the switches present in IMD devices. The equivalent diagram of the screen 20 is represented in FIG. 3B. The screen 20 comprises a plurality of basic cells $R_1C_1$, $R_2C_2$, $R_3C_3$ ... $R_iC_i$ ... $R_mC_m$ spread between its point of origin and its end point. The basic resistances $R_i$ together form the insulation resistance of the screen 20 relative to the ground and the basic capacitances $C_i$ form the leak capacitance of the screen 20 relative to the ground.

According to the present invention, at least two low frequency currents $i_1$, $i_2$ of respective frequencies $f_1$, $f_2$ and of pulsations $\omega_1$, $\omega_2$ are injected at the point of origin of the screen 20, for example currents in the order of a few milliamperes oscillating respectively at 1 Hz and 2 Hz. The currents $i_1$, $i_2$ are delivered by a voltage or current generator, preferably a voltage generator 23 delivering alternating voltages u1, u2 of the type $$u1 = U1 \cos(2\pi f_1 t)$$

$$u2 = U2 \cos(2\pi f_2 t)$$

having known amplitudes U1, U2 in the order of a few volts. The ground terminal of the generator 23 is connected to the ground so as to form a conduction loop passing through the screen 20 and the ground. The amplitudes of currents $i_1$, $i_2$ are measured at various points $P_1, P_2, P_3 \ldots P_i \ldots P_n$ along the screen 20, by means of a hook-on ammeter 30 connected to a measuring device 31.

These first steps of the method according to the present invention are similar to those of the method described in the international application PCT/FR99/02288, the purpose of which is to locate an insulation defect. It will be shown below that the detection of the amplitudes of currents $i_1$ and $i_2$ allows the imaginary part of each current to be calculated, and that the calculation of the imaginary part of currents $i_1$, $i_2$ at several measuring points $P_1, P_2, \ldots P_i, \ldots P_n$ allows a continuity defect to be located.

Figure 3C:
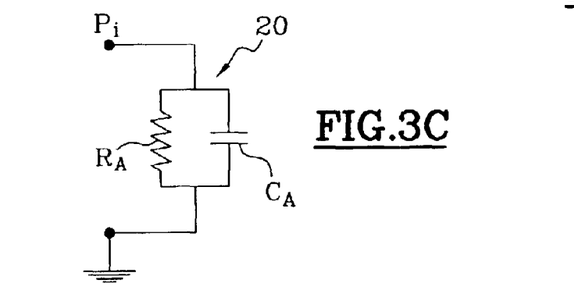
FIG. 3C is the equivalent diagram of the screen in FIG. 3A seen from a measuring point.

Seen from any measuring point $P_i$, the screen 20 can be represented as shown in FIG. 3C, in the form of a resistance $R_A$ and a capacitance $C_A$ in parallel. The resistance $R_A$ is the insulation resistance of the part of the screen 20 located downstream from the measuring point $P_i$, depending on the flow direction of the currents $i_1$, $i_2$, and is constituted by all the basic insulation resistances $R_i$ downstream from this point. The capacitance $C_A$ is the leak capacitance of the part of the screen 20 located downstream from the measuring point $P_i$, and is constituted by all the basic leak capacitances $C_i$ downstream from this point. As the linear resistance of the screen 20 is negligible, the voltages present at the terminals of the equivalent circuit $R_A C_A$ are the voltages u1, u2 of amplitudes $U_1$, $U_2$ applied to the point of origin of the screen.

Figure 4A:
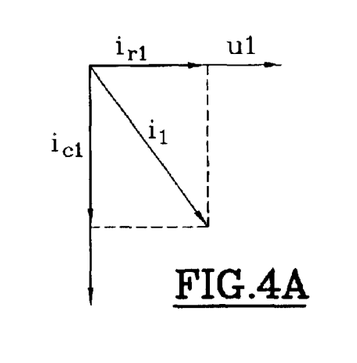
FIGS. 4A, 4B are vector representations of currents involved in the method according to the present invention.
Figure 4B:
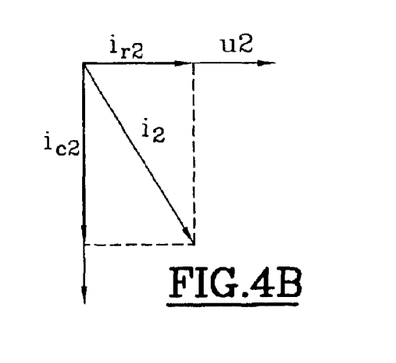

The vector representation of the currents $i_1$, $i_2$ in FIGS. 4A, 4B shows that each current comprises a real part $i_{r1}$, $i_{r2}$ in phase with the voltage $u_1$, respectively $u_2$, and an imaginary part $i_{c1}$, $i_{c2}$ out of phase by 90° relative to the real part, which complies with the following relations:

$$|i_1|^2 = i_{r1}^2 + i_{c1}^2 \quad (1)$$

$$|i_2|^2 = i_{r2}^2 + i_{c2}^2 \quad (2)$$

$|i_1|$ and $|i_2|$ being the modules, or measurable amplitudes, of currents $i_1$, $i_2$.

The real parts $i_{r1}$, $i_{r2}$ of currents $i_1$, $i_2$ are linked by the following relations:

$$i_{r1} = U_1/R_A \quad (3)$$

$$i_{r2} = U_2/R_A \quad (4)$$

$$R_A = U_1/i_{r1} = U_2/i_{r2} \quad (5)$$

$$i_{r1} = i_{r2}(U_1/U_2) \quad (6)$$

The imaginary parts $i_{c1}$, $i_{c2}$ of currents $i_1$, $i_2$ are linked by the following relations:

$$i_{c1} = C_A \omega_1 U_1 \quad (7)$$

$$i_{c2} = C_A \omega_2 U_2 \quad (8)$$

$$C_A = i_{c1}/\omega_1 U_1 = i_{c2}/\omega_2 U_2 \quad (9)$$

$$i_{c1} = i_{c2}(U_1 \omega_1 / U_2 \omega_2) \quad (10)$$

By injecting into the relation (1) the expressions of currents $i_{r1}$ and $i_{c1}$ given by the relations (6) and (10), the result is:

$$|i_1|^2 = i_{r2}^2(U_1/U_2)^2 + i_{c2}^2(U_1/U_2)^2(\omega_1/\omega_2)^2 \quad (11)$$

By multiplying the relation (2) by the term $(U_1/U_2)^2$:

$$|i_2|^2(U_1/U_2)^2 = i_{r2}^2(U_1/U_2)^2 + i_{c2}^2(U_1/U_2)^2 \quad (12)$$

By subtracting the relation (12) from the relation (11), the result is, after simplification, the expression of current $i_{c2}$:

$$i_{c2} = (\omega_2/U_1)\sqrt{[[(U_2|i_1|)^2 - (U_1|i_2|)^2]/(\omega_1^2 - \omega_2^2)]} \quad (13)$$

By combining the relation (10) and the relation (13), the result is the expression of current $i_{c1}$:

$$i_{c1} = (\omega_1/U_2)\sqrt{[[(U_2|i_1|)^2 - (U_1|i_2|)^2]/(\omega_1^2 - \omega_2^2)]} \quad (14)$$

By combining the relations (7) and (14) as follows:

$$i_{c1} = C_A \omega_1 U_1 = (\omega_1/U_2)\sqrt{[[(U_2|i_1|)^2 - (U_1|i_2|)^2]/(\omega_1^2 - \omega_2^2)]} \quad (15)$$

the result is the expression of the downstream leak capacitance $C_A$:

$$C_A = (1/U_1 U_2)\sqrt{[[(U_2|i_1|)^2 - (U_1|i_2|)^2]/(\omega_1^2 - \omega_2^2)]} \quad (16)$$

Finally, as the parameters $U_1$, $U_2$, $\omega_1$ and $\omega_2$ are constants, a general formula of the type:

$$K_1\sqrt{[K_2|i_1|^2 - K_3|i_2|^2]} \quad (17)$$

in which $|i_1|$ and $|i_2|$ are the currents measured by means of the hook-on ammeter and $K_1$, $K_2$, $K_3$ are constants, covers the relations (13) (14) (16) and allows the current $i_{c1}$ or the current $i_{c2}$ or even the downstream leak capacitance $C_A$ to be calculated, according to the value given to the constants $K_1$, $K_2$, $K_3$.

Figure 5:
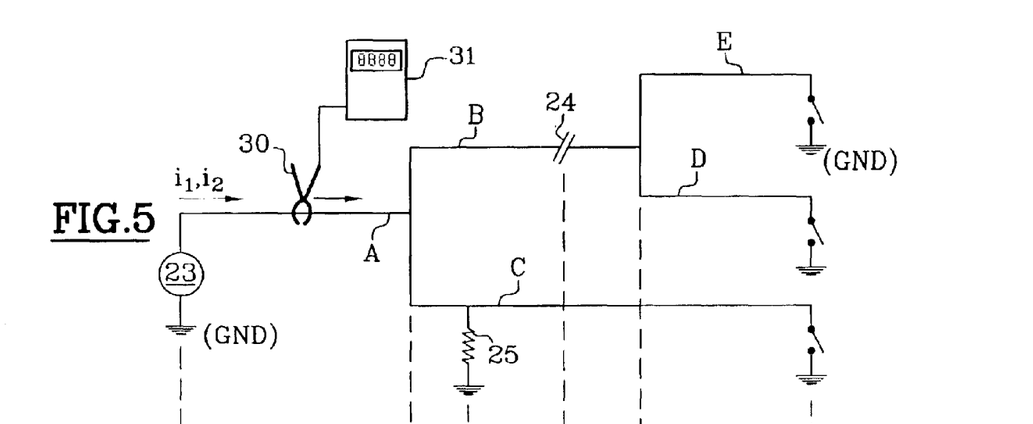
FIG. 5 represents, in a simplified manner, the network of cables in FIG. 2 and shows one application of the method according to the present invention.

It will now be shown using a practical example shown in FIG. 5 that the relations that have just been described are directly applicable to locating a continuity defect. FIG. 5 schematically represents the screens A, B, C, D, E of a network of telecommunication cables similar to the one in FIG. 2. The screens are connected and form conductive segments AC, ABD and ABE. The point of origin of the screen A and the end points of the screens C, D, E are disconnected from the ground to implement the method of the present invention. The generator 23 is connected to the point of origin of the screen A. The currents $i_1$, $i_2$ circulate in the screen A and are divided in the screens B and C, then in the screens D and E.

Figure 6:
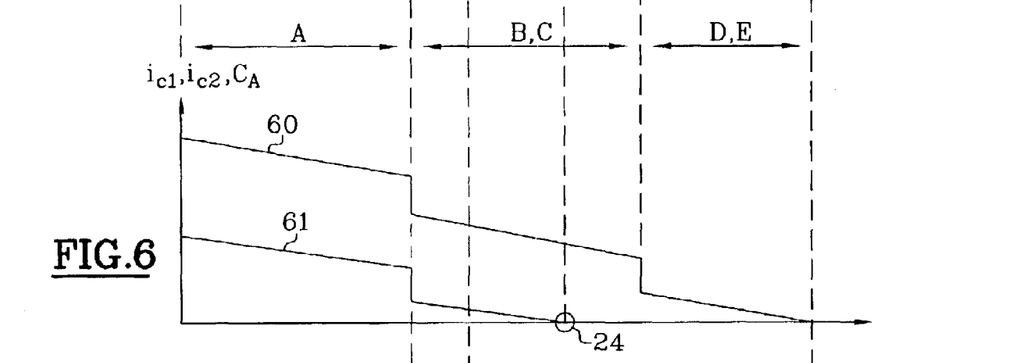
FIGS. 6 to 8 represent in the form of curves the results of measurements of current carried out on a segment of the network in FIG. 5.

In FIG. 6, the curve 60 represents the profile of the imaginary currents $i_{c1}$, $i_{c2}$ along the segment ABD when the latter does not have a continuity defect, and the curve 61 represents the profile of the currents $i_{c1}$, $i_{c2}$ in the presence of a continuity defect 24 situated here on the screen B. The curves 60, 61 also represent the profile of the downstream capacitance $C_A$ along the segment ABD, the relations (13) (14) and (16) being proportional. These curves are traced by means of the hook-on ammeter 30 and the measuring device 31, an example of an embodiment of which will be described below.

The curves 60, 61 are parallel and show a regular decline with a clear reduction of the currents $i_{c1}$, $i_{c2}$ and of the capacitance $C_A$ at each division of the network into two different branches BC and DE. The significant difference between the two curves is that the curve 60 reaches the value zero at the end of the screen D, while the curve 61, of a lower level, reaches the zero at the point of discontinuity 24. Therefore, in practice, it is easy to locate the continuity defect 24 by observing the evolution of the currents $i_{c1}$, $i_{c2}$ and/or of the leak capacitance $C_A$. When the currents $i_{c1}$, $i_{c2}$ or the capacitance $C_A$ become zero before the end of the conductive segment tested is reached, that indicates the presence of a continuity defect.

Compared to a simple detection of current, the method of the present invention provides the advantage of great measuring sensitivity and excellent precision, and only requires currents $i_1$, $i_2$ and voltages u1, u2 of low value, oscillating at low frequency and not disturbed by electromagnetic disturbances present in the region of 50 Hz. The calculation of the imaginary part of currents $i_1$, $i_2$ allows, furthermore, to be free from losses of sensitivity due to an insulation defect, when the insulation defect is not very high and is for example in the order of a few kilo ohms. Moreover, the method of the present invention allows the leak capacitance $C_A$ to be calculated and meets a long-felt need to analyse the electric characteristics of telecommunication cables. It is, however, clear that the calculation of the capacitance $C_A$ is not essential to locating a continuity defect, as the method can be implemented by calculating the imaginary part of one of the currents $i_1$, $i_2$.

Furthermore, in one variation of an embodiment of the method, the voltages U1, U2 are equal and the relations (13) and (14) are simplified:

$$i_{c2} = \omega_2 \sqrt{[(|i_1|^2 - |i_2|^2)/(\omega_1^2 - \omega_2^2)]} \quad (13) \rightarrow (18)$$

$$i_{c1} = \omega_1 \sqrt{[(|i_1|)^2 - |i_2|^2)/(\omega_1^2 - \omega_2)]} \quad (14) \rightarrow (19)$$

In this case, it is not necessary to know the applied voltage U to calculate the imaginary parts of the currents $i_1$, $i_2$ and to locate a continuity defect.

The teaching of the international application PCT/FR99/02288 will now be completed and it will be shown that the method that is described in it allows the real part of each current and the insulation resistance $R_A$ to be determined, in the general case in which the voltages U1 and U2 have any values that are not necessarily identical. By multiplying the relation (2) given above by the term $(\omega_1 U_1/\omega_2 U_2)^2$, the following relation is obtained:

$$(\omega_1 U_1/\omega_2 U_2)^2 |i_2|^2 = (\omega_1 U_1/\omega_2 U_2)^2 i_{r2}^2 + (\omega_1 U_1/\omega_2 U_2)^2 i_{c2}^2 \quad (20)$$

By subtracting the relation (21) from the relation (11), the result is:

$$i_{r2} = (1/U_1)\sqrt{[(\omega_1 U_1 |i_2|)^2 - (\omega_2 U_2 |i_1|)^2]/(\omega_1^2 - \omega_2^2)} \quad (21)$$

By combining the relations (6) and (21):

$$i_{r1} = (1/U_2)\sqrt{[(\omega_1 U_1 |i_2|)^2 - (\omega_2 U_2 |i_1|)^2]/(\omega_1^2 - \omega_2^2)} \quad (22)$$

By combining the relation (5) with one of the relations (21) or (22):

$$R_A = U_1 U_2/\sqrt{[(\omega_1 U_1 |i_2|)^2 - (\omega_2 U_2 |i_1|)^2]/(\omega_1^2 - \omega_2^2)} \quad (23)$$

As the parameters $U_1$, $U_2$, $\omega_1$ and $\omega_2$ are constants, a general formula of the type:

$$K_4 \sqrt{[K_5 |i_2|^2 - K_6 |i_1|^2]} \quad (24)$$

in which $K_4$, $K_5$, $K_6$ are constants and $|i_1|$, $|i_2|$ are the currents measured, covers the relations (21) (22) (23). Depending on the value given to the constants $K_4$ to $K_6$, this formula allows the current $i_{r1}$, the current $i_{r2}$ or even the resistance $R_A$ to be calculated (by reversing the result).

As above, the amplitudes U1, U2 of voltages u1, u2 applied to the point of origin may be chosen to be identical. In this case, the currents $i_{r1}$, $i_{r2}$ are identical, the relations (21) and (22) are simplified and become independent of the value of the voltage U applied to the point of origin, which can allow the currents $i_{r1}$, $i_{r2}$ to be calculated without knowing the voltage U.

Figure 7:
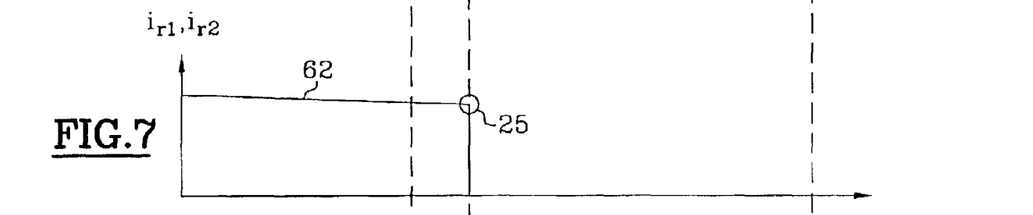
Figure 8:
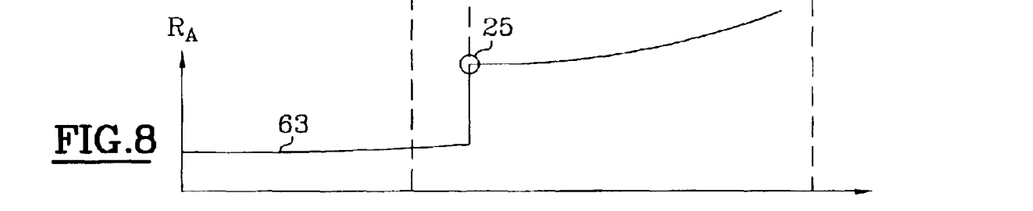

One example of locating an insulation defect, here a defect 25 present on the screen C in FIG. 5, is shown by the curves 62, 63 in FIGS. 7 and 8. The curve 62 represents the profile of currents $i_{r1}$, $i_{r2}$ and the curve 63 represents the profile of the downstream insulation resistance $R_A$ along the segment AC. Starting at the point of origin of the screen A, the curve 62 has a profile that is roughly flat up to the defect point 25, without any noticeable reduction in the currents $i_{r1}$, $i_{r2}$ at the point of division of the network into two different branches BC. In fact, the majority of the current passes in the screen C due to the insulation defect 25, which is much lower than the insulation resistance of the screens. However, a sharp drop of the currents $i_{r1}$, $i_{r2}$ can be observed when the defect 25 is reached. This reduction is not linked to the topography of the network and is significant of the presence of the defect 25, through which the currents $i_{r1}$, $i_{r2}$ leak into the ground. The curve 63 in FIG. 8 leads to the same conclusion, the downstream insulation resistance $R_A$ sharply increasing when the insulation defect 25 is reached.

Now an example of an embodiment of a measuring device 31 according to the present invention will be described, intended here to calculate the leak capacitance $C_A$ and the insulation resistance $R_A$ of a conductive screen.

Figure 9:
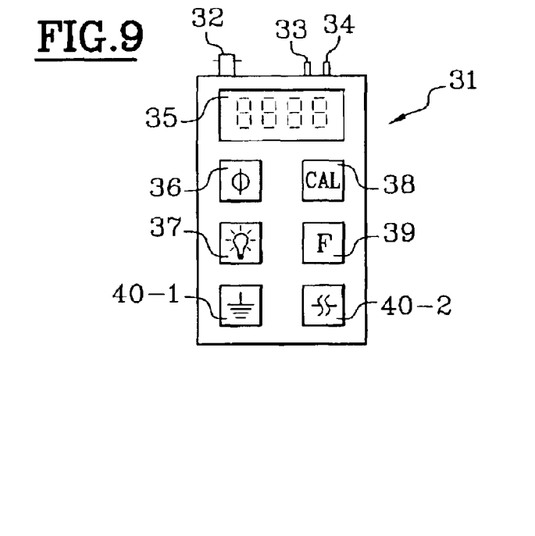
FIG. 9 is an external view of a measuring device according to the present invention.

FIG. 9 is an external view of the device 31. The device 31 comprises a connection plug 32 of the hook-on ammeter, two calibration terminals 33, 34, a display 35, an on/off key 36, a display 35 light-up key 37, a calibration key 38, a filter key 39, a key 40-1 to trigger a calculation of insulation resistance $R_A$ and a key 40-2 to trigger a calculation of leak capacitance $C_A$.

Figure 10:
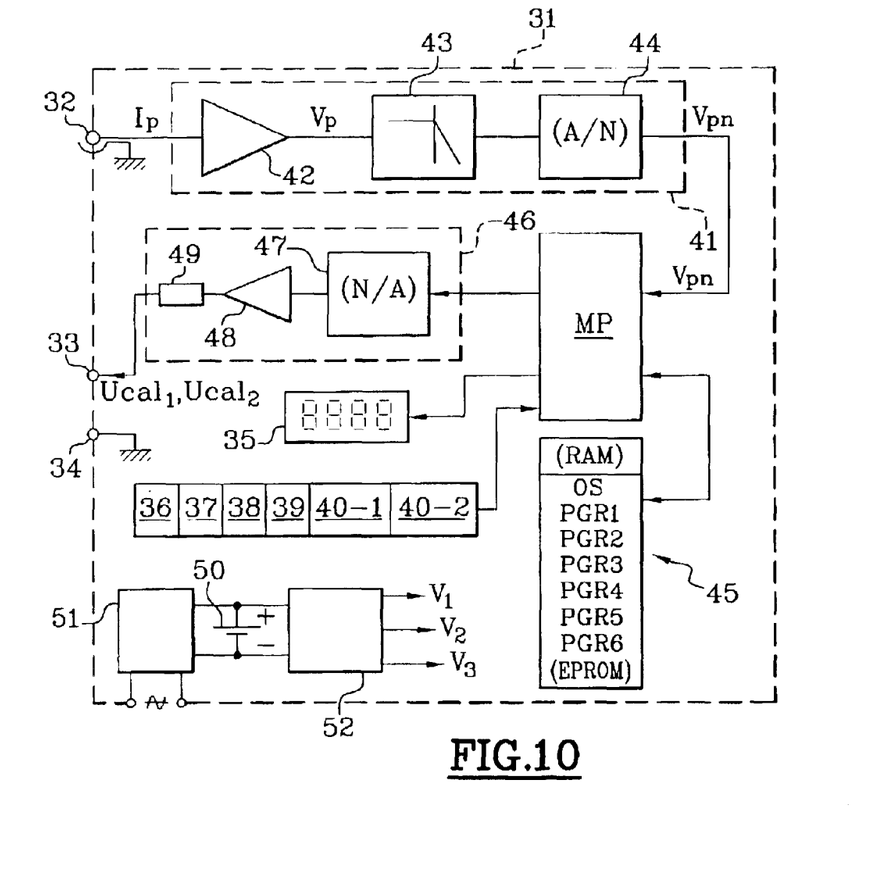
FIG. 10 is the wiring diagram in block form of the measuring device in FIG. 9.

FIG. 10 represents in block form the electrical design of the device 31. This comprises a sampling chain 41, a microprocessor MP fitted with a memory 45, a calibration circuit 46, a storage battery 50, a battery 50 load circuit 51 and a power supply test circuit 52 delivering various voltages V1, V2, V3 required by the operation of the various parts. The display 35 and the keys 36 to 40 are also represented and are connected to the microprocessor.

The sampling chain 41 comprises a current/voltage amplifier 42 the input of which is connected to the plug 32 and receives the current Ip delivered by the hook-on ammeter (not shown). The amplifier 42 provides a substantial gain for the detection of low currents in the order of a tenth of a microampere in the presence of insulation defects of several hundred KΩ. The output of the amplifier 42 delivers a voltage Vp and is connected to the input of an analog-digital converter 44 through a low-pass filter 43, a Butterworth filter for example having a 15 Hz cut-off frequency and a high cut-off slope (−55 dB to 50 Hz) to remove the disturbances at 50 Hz. The converter 44 is of the sigma-delta type with a serial output and comprises an internal digital filter of the $6^{th}$ order. The sampling frequency is chosen at 512 Hz with a resolution of 16 bits. The output of the converter 44 delivers a sampled signal Vpn sent to an input of the microprocessor.

The calibration circuit 46 comprises a digital/analog converter 47 the digital input of which is connected to the microprocessor and the output of which is connected to the calibration terminal 33 through a voltage amplifier 48 and a standard resistance 49 of value $R_{cal}$.

The memory 45 comprises a volatile RAM-type memory, to store temporary data, and a non-volatile EPROM-type memory. Principally, the EPROM memory comprises the operating system OS of the microprocessor, a Fast Fourier Transform (FFT) program PGR1, an amplitude calculation program PGR2, a voltage/current conversion program PGR3, a leak capacitance $C_A$ or insulation resistance $R_A$ calculation program PGR4, a calibration program PGR5, and a main program PGR6 ensuring the coordination of all the programs and the execution of the instructions received by the keys 36 to 40 and the testing of the various parts of the device 31.

By means of these various programs, the microprocessor extracts from the sampled signal Vpn two signals Vpn1, Vpn2 the respective frequencies of which correspond to the measuring frequencies $f_1$, $f_2$, here equal to 1 Hz and 2 Hz, and calculates the amplitudes Vpnmax1, Vpnmax2 of these signals Vpn1, Vpn2. The microprocessor then converts the amplitudes Vpnmax1, Vpnmax2 into amplitudes of currents $|i_1|$, $|i_2|$ by means of conversion coefficients KVI1 and KVI2:

$$|i_1| = KVI1 \; Vpnmax1 \quad (25)$$

$$|i_2| = KVI2 \; Vpnmax2 \quad (26)$$

The microprocessor then calculates the capacitance $C_A$ or the resistance $R_A$ by means of relations (16) or (23).

Figure 11:
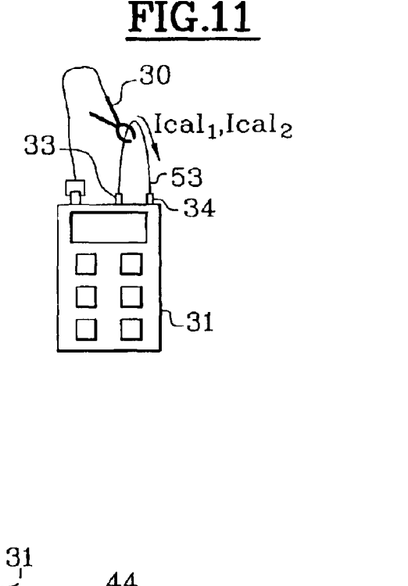
FIG. 11 shows a calibration step of the measuring device.

According to one aspect of the present invention, the conversion coefficients KVI1, KVI2 are determined by the calibration program PGR5, which is activated by one press on the key 38 "CAL" (calibration). The program PGR5 contains a table of data comprising the sampled values of a bifrequency signal of frequencies $f_1$, $f_2$. These data are sent to the input of the converter 47, used as a frequency synthesizer, the output of which delivers corresponding analog voltages. At the output of the amplifier 48, there are two calibration voltages $U_{cal1}$, $U_{cal2}$ oscillating at the measuring frequencies $f_1$, $f_2$. During the calibration phase, the terminals 33 and 34 are linked by a conductor wire 53 as shown in FIG. 11, and the hook-on ammeter 30 is arranged around the wire 53. The wire 53 is passed through by two calibration currents $I_{cal1}$, $I_{cal2}$ equal to:

$$I_{cal1} = U_{cal1}/R_{cal} \quad (27)$$

$$I_{cal2} = U_{cal2}/R_{cal} \quad (28)$$

the values of which are known by the program PGR5. These currents are detected by the ammeter 30 and the microprocessor calculates corresponding values Vpnmax1, Vpnmax2 using the sampled signals Vpn1, Vpn2. The values Vpnmax1, Vpnmax2 allow the microprocessor to calibrate the conversion coefficients by means of the following relations:

$$KVI1 = (U_{cal1}/R_{cal})/Vpnmax1 = I_{cal1}/Vpnmax1 \quad (29)$$

$$KVI2 = (U_{cal2}/R_{cal})/Vpnmax2 = I_{cal2}/Vpnmax2 \quad (30)$$

Tables 1, 2 and 3 below summarize the operation of the measuring device 31. It will be understood that variations and different embodiments of this device may be made. For example, it may be limited to the production of a measuring device calculating only the imaginary and real parts of a bifrequency current without calculating the capacitance $C_A$ and the resistance $R_A$. Therefore, the keys 40-1 and 40-2 could be used to trigger the calculation of the real part and the calculation of the imaginary part of one of the currents $i_1$, $i_2$, which would be sufficient to locate insulation or continuity defects. The calculation of the capacitance $C_A$ and of the resistance $R_A$ is an additional advantage allowing the electrical characteristics of a telecommunication cable to be analysed.

Generally speaking, the method of the present invention is applicable to any conductor element other than a metal screen of a telecommunication cable, insofar as the conductor element has, relative to the ground or relative to any other conductor used as reference conductor, a measurable leak capacitance and insulation resistance.

Also, although the method described above is based, for the sake of simplicity, on the injection of two currents, it will be understood by those skilled in the art that the principles and methods of calculation set out above are transposable to a detection done by means of three, or even four currents or more having different frequencies.

TABLE 1

Measurements of insulation resistance $R_A$

| | |
|---|---|
| | Press on the key 40-1 |
| E1 | Sampling the signal Vp for 4.25 seconds at 512 Hz (i.e. 512 samples a second). |
| E2 | Removal of the samples of the sampled signal Vpn corresponding to the first 25 hundredths of a second (start-up time of the low-pass filter 43) |
| E3 | Fourier transform of the signal of remaining samples Vpn with an analysis fineness of 0.25 Hz in a frequency band ranging from 0 Hz to 256 Hz and extraction of the signals Vpn1 and Vpn2 at 1 Hz and 2 Hz |
| E4 | Calculation of the amplitude Vpnmax1 of the signal Vpn1 at 1 Hz and of the amplitude Vpnmax2 of the signal Vpn2 at 2 Hz. |
| E5 | Conversion into current values of the values Vpnmax1, Vpnmax2, by means of conversion coefficients KVI1 and KVI2: $\|i_1\|$ = KVI1 Vpnmax1 $\|i_2\|$ = KVI2 Vpnmax2 |
| E6 | If filter mode selected (key 39): steps E1 to E5 repeated 4 times; calculation of the average of the last four results: $\|i_1\| = \Sigma_{(4)}\|i_1\|/4$ $\|i_2\| = \Sigma_{(4)}\|i_2\|/4$ |
| E7 | Calculation of $R_A$ according to relation (23) |
| E8 | Display of $R_A$ |

TABLE 2

Measurement of leak capacitance $C_A$

| | |
|---|---|
| | Press on the key 40-2 |
| E1 | Step identical to the one in table 1 |
| E2 | Step identical to the one in table 1 |
| E3 | Step identical to the one in table 1 |
| E4 | Step identical to the one in table 1 |
| E5 | Step identical to the one in table 1 |
| E6 | Step identical to the one in table 1 |
| E9 | Calculation of $C_A$ according to relation (16) |
| E10 | Display of $C_A$ |

TABLEAU 3

Calibration

| | |
|---|---|
| | Press on the key 38 |
| F1 | Send the calibration voltage $U_{cal}$ to one of the calibration terminals of the device |
| E1 | Step identical to the one in measuring mode |
| E2 | Step identical to the one in measuring mode |
| E3 | Step identical to the one in measuring mode |
| E4 | Step identical to the one in measuring mode |
| F2 | Determination of conversion coefficients KVI1 KVI2: KVI1 = ($U_{cal1}/R_{cal}$) /Vpnmax1 = $I_{cal1}$/Vpnmax1 KVI2 = ($U_{cal2}/R_{cal}$) /Vpnmax2 = $I_{cal2}$/Vpnmax1 |
| F3 | Repeat steps E1 to E4 and F2 three times |
| F4 | Calculation of the average of the last four results: KVI1 = $\Sigma_{(4)}$KVI1/4 KVI2 = $\Sigma_{(4)}$KVI2/4 |
| F5 | Store the conversion coefficients in the memory |

What is claimed is:

1. A method for testing a conductor element applicable to locating a continuity defect of the conductor element, the conductor element having, relative to a reference conductor, an insulation resistance and a leak capacitance spread along the conductor element, the method comprising:

a step of injecting into the conductor element at least two currents of different frequencies by means of a current or voltage generator, one terminal of which is connected to the reference conductor, a plurality of steps of measuring the amplitudes of currents at various measuring points chosen along the conductor element, and a plurality of steps of calculating, after each measurement, the imaginary part of at least one of the currents and/or the downstream leak capacitance of the conductor element, an electrical continuity defect of the conductor element being located when the imaginary part calculated and/or the downstream leak capacitance proves to be zero before the end of the conductor element is reached.

2. The method according to claim 1, applicable to locating an electrical insulation defect of the conductor element relative to the reference conductor, further comprising a step of calculating the real part of at least one of the currents and/or the insulation resistance downstream from a measuring point.

3. The method according to claim 2, further comprising a plurality of steps of measuring the amplitudes of currents at various measuring points, and a plurality of steps of calculating, after each measurement, the real part of at least one of the currents and/or the downstream insulation resistance, an electrical insulation defect being located when the real part calculated shows a clear attenuation and/or when the downstream insulation resistance rapidly rises without this being justified by the topography of the conductor element.

4. The method according to claim 1, comprising a step of calculating a formula of type:

$$K_x \sqrt{[K_y|i_1|^2 - K_z|i_2|^2]}$$

in which $|i_1|$ and $|i_2|$ are the amplitudes of currents and $K_x$, $K_y$, $K_z$ are constants.

5. The method according to claim 1, wherein the conductor element comprises several telecommunication cable screens connected to each other, and in that the reference conductor is the ground.

6. A device for testing a conductor element, comprising a connection terminal to a contactless current sensor, an analog/digital conversion circuit of the signal delivered by the current sensor, and calculation means arranged to analyze the signal delivered by the current sensor and to extract the amplitudes of at least two currents of different frequencies present in the signal delivered, and to calculate the imaginary part of at least one of the currents and/or an electric capacitance by means of a formula of type:

$$K_1 \sqrt{[K_2|i_1|^2 - K_3|i_2|^2]}$$

in which $|i_1|$ and $|i_2|$ are the amplitudes of currents and $K_1$, $K_2$, $K_3$ are constants.

7. The device according to claim 6, wherein the calculation means are also arranged to calculate the real part of at least one of the currents and/or an electric resistance, by means of a formula of type:

$$K_4 \sqrt{[K_5|i_1|^2 - K_6|i_1|^2]}$$

in which $K_4$, $K_5$ and $K_6$ are constants.

8. The device according to claim 6, further comprising selection means to choose between:

the calculation of the imaginary part of at least one of the currents and/or the calculation of an electric capacitance, on the one hand, and the calculation of the real part of at least one of the currents and/or an electric resistance, on the other hand.

9. The device according to claim 6, intended to be connected to a hook-on ammeter, and comprising calibration terminals intended to be interconnected during a calibration phase, and means for injecting onto one of the calibration terminals at least two calibration currents of different frequencies through a standard resistance.

* * * * *

UNITED STATES PATENT AND TRADEMARK OFFICE
CERTIFICATE OF CORRECTION

PATENT NO. : 6,825,670 B2
DATED : November 30, 2004
INVENTOR(S) : Jean Bussinger Page 1 of 1

It is certified that error appears in the above-identified patent and that said Letters Patent is hereby corrected as shown below:

Column 7,
Line 30, "$i_{c1}=\omega_1\sqrt{[(|i_1|)^2-|i_2|^2)/(\omega_1^2-\omega_2)]}$" should read -- $i_{c1}=\omega_1\sqrt{[(|i_1|)^2-|i_2|^2)/(\omega_1^2-\omega_2^2]}$ --
Line 50, "$i_{r1}=(1/U_2)\sqrt{[[(\omega_1U_1|i_2|)^2-(\omega_2U_2|)^2]/(\omega_1^2-\omega_2^2)]}$" should read -- $i_{r1}=(1/U_2)\sqrt{[[(\omega_1U_1|i_2|)^2-(\omega_2U_2|i_1|)^2]/(\omega_1^2-\omega_2^2)]}$ --

Column 8,
Line 20, "$i_{r1}, l_{r2}$" should read -- $i_{r1}, i_{r2}$ --.

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,825,670 B2
DATED : November 30, 2004
INVENTOR : Jean Bussinger

It is certified that error appears in the above-identified patent and that said Letters Patent is hereby corrected as shown below:

Column 7,
Line 30, "$i_{c1}=\omega_1\sqrt{[(|i_1|)^2-|i_2|^2)/(\omega_1^2-\omega_2)]}$" should read
-- $i_{c1}=\omega_1\sqrt{[(|i_1|)^2-|i_2|^2)/(\omega_1^2-\omega_2^2]}$ --
Line 50, "$i_{r1}=(1/U_2)\sqrt{[[(\omega_1U_1|i_2|)^2-(\omega_2U_2|)^2]/(\omega_1^2-\omega_2^2)]}$" should read
-- $i_{r1}=(1/U_2)\sqrt{[[(\omega_1U_1|i_2|)^2-(\omega_2U_2|i_1|)^2]/(\omega_1^2-\omega_2^2)]}$ --

Column 8,
Line 20, "$i_{r1}, l_{r2}$" should read -- $i_{r1}, i_{r2}$ --.

This certificate supersedes Certificate Of Correction issued April 19, 2005.

Signed and Sealed this

Eleventh Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,825,670 B2
DATED : November 30, 2004
INVENTOR(S) : Jean Bussinger Page 1 of 1

It is certified that error appears in the above-identified patent and that said Letters Patent is hereby corrected as shown below:

Column 7,
Line 30, "$i_{c1}=\omega_1\sqrt{[(|i_1|)^2-|i_2|^2)/(\omega_1^2-\omega_2)]}$" should read
-- $i_{c1}=\omega_1\sqrt{[(|i_1|)^2-|i_2|^2)/(\omega_1^2-\omega_2^2)}$ --
Line 50, "$i_{r1}=(1/U_2)\sqrt{[[(\omega_1U_1|i_2|)^2-(\omega_2U_2|)^2]/(\omega_1^2-\omega_2^2)]}$" should read
-- $i_{r1}=(1/U_2)\sqrt{[[(\omega_1U_1|i_2|)^2-(\omega_2U_2|i_1|)^2]/(\omega_1^2-\omega_2^2)]}$ --

Column 8,
Line 20, "$i_{r1}, I_{r2}$" should read -- $i_1, i_2$ --.

This certificate supersedes Certificate of Correction issued April 19, 2005 and October 11, 2005.

Signed and Sealed this

Thirteenth Day of June, 2006

JON W. DUDAS
*Director of the United States Patent and Trademark Office*